(12) United States Patent
Hussey et al.

(10) Patent No.: US 12,342,485 B2
(45) Date of Patent: Jun. 24, 2025

(54) MOTOR CONTROL CENTER BUCKETS WITH INTERLOCKED COVER-MOUNTED POWER DISCONNECT SWITCH MECHANISMS

(71) Applicant: EATON INTELLIGENT POWER LIMITED, Dublin (IE)

(72) Inventors: Matthew R. Hussey, Fuquay-Varina, NC (US); Duncan Scott McBryde, Dunn, NC (US); Kristy L. Burney, Supply, NC (US)

(73) Assignee: Eaton Intelligent Power Limited, Dublin (IE)

( * ) Notice: Subject to any disclaimer, the term of this patent is extended or adjusted under 35 U.S.C. 154(b) by 201 days.

(21) Appl. No.: 18/052,249

(22) Filed: Nov. 3, 2022

(65) Prior Publication Data

US 2023/0146739 A1    May 11, 2023

Related U.S. Application Data

(60) Provisional application No. 63/276,392, filed on Nov. 5, 2021.

(51) Int. Cl.
| | |
|---|---|
| *G06F 1/16* | (2006.01) |
| *H02K 11/30* | (2016.01) |
| *H05K 5/00* | (2025.01) |
| *H05K 5/02* | (2006.01) |
| *H05K 5/03* | (2006.01) |
| *H05K 7/00* | (2006.01) |

(52) U.S. Cl.
CPC ............. *H05K 5/023* (2013.01); *H02K 11/30* (2016.01); *H05K 5/0221* (2013.01); *H05K 5/03* (2013.01)

(58) Field of Classification Search
CPC ........ H01H 9/22; H05K 5/023; H05K 5/0221; H05K 5/03; H05K 5/0217; H05K 5/0234; H05K 5/04; H05K 5/06; H05K 5/10
See application file for complete search history.

(56) References Cited

U.S. PATENT DOCUMENTS

| | | | |
|---|---|---|---|
| 6,992,256 B1 * | 1/2006 | Wiley .................... | H01H 71/52 200/321 |
| 2005/0224323 A1 * | 10/2005 | Bortolloni ................ | H01H 9/22 200/50.05 |

(Continued)

*Primary Examiner* — Anthony M Haughton
(74) *Attorney, Agent, or Firm* — Stanek Lemon Crouse & Meeks, PA

(57) ABSTRACT

An apparatus includes an enclosure (e.g., an MCC bucket enclosure) having a cover configured to be opened, a disconnect switch positioned in the enclosure, and a shaft having a first end inserted in the disconnect switch and configured to actuate at least one switch in the disconnect switch by rotation of the shaft. The apparatus further includes a switch handle mechanism mounted on the cover, configured to receive a second end of the shaft when the cover is in a closed position, and comprising a switch handle configured to rotate the shaft. The switch handle mechanism may be configured to allow withdrawal of the second end of the shaft from the switch handle mechanism when the switch handle is in a first position to allow opening of the cover and to prevent withdrawal of the second end of the shaft from the switch handle mechanism wherein the switch handle is in a second position to prevent opening of the cover.

10 Claims, 6 Drawing Sheets

(56) References Cited

U.S. PATENT DOCUMENTS

| | | | | |
|---|---|---|---|---|
| 2010/0065406 A1* | 3/2010 | Billard | ............... | H01H 9/22 |
| | | | | 200/50.05 |
| 2011/0110049 A1* | 5/2011 | Lehtola | ............... | H05K 7/1409 |
| | | | | 361/807 |
| 2012/0162861 A1* | 6/2012 | Manahan | ............... | H01H 3/06 |
| | | | | 200/331 |
| 2013/0015940 A1* | 1/2013 | Dunker | ............... | H01H 9/104 |
| | | | | 337/12 |
| 2014/0262711 A1* | 9/2014 | Clark | ............... | H01H 9/22 |
| | | | | 200/302.1 |
| 2015/0382492 A1* | 12/2015 | Oneufer | ............... | H02B 13/02 |
| | | | | 312/295 |
| 2016/0099117 A1* | 4/2016 | Dunker | ............... | H01H 71/52 |
| | | | | 200/5 R |
| 2017/0175424 A1* | 6/2017 | Bulancea | ............... | E05B 15/00 |

\* cited by examiner

MOTOR CONTROL CENTER BUCKETS WITH INTERLOCKED COVER-MOUNTED POWER DISCONNECT SWITCH MECHANISMS

RELATED APPLICATIONS

The present application claims priority to U.S. Provisional Patent Application No. 63/276,392 filed Nov. 5, 2021, entitled MOTOR CONTROL CENTER BUCKETS WITH INTERLOCKED COVER-MOUNTED POWER DISCONNECT SWITCH MECHANISMS, which is incorporated by reference herein in its entirety.

BACKGROUND

The inventive subject matter relates to motor control center (MCC) units and, more particularly, to switch interlocks for MCC units.

Motor control centers (MCCs) typically include a plurality of "buckets," which are compact modular units that contain various control circuits, such as motor drive circuitry, switchgear, metering devices, and the like. The buckets are typically installed in a larger assembly that includes, for example, AC power buses to which the buckets are connected using spring-loaded "stabs" or similar connector structures. The buckets are typically rectangular enclosures having front panels that may be opened to access the circuitry therein for easy service and removal. MCC buckets may have different sizes depending on the functions and hardware included.

SUMMARY

Some embodiments provide an apparatus including an enclosure (e.g., an MCC bucket enclosure) having a cover configured to be opened, a disconnect switch positioned in the enclosure, and a shaft having a first end inserted in the disconnect switch and configured to actuate at least one switch in the disconnect switch by rotation of the shaft. The apparatus further includes a switch handle mechanism mounted on the cover, configured to receive a second end of the shaft when the cover is in a closed position, and comprising a switch handle configured to rotate the shaft. The switch handle mechanism may be configured to allow withdrawal of the second end of the shaft from the switch handle mechanism when the switch handle is in a first position to allow opening of the cover and to prevent withdrawal of the second end of the shaft from the switch handle mechanism wherein the switch handle is in a second position to prevent opening of the cover.

In some embodiments, the apparatus may further include a locking pin disposed proximate the second end of the shaft. The switch handle mechanism may include a slot configured to allow passage of the locking pin therethrough when the switch handle is in the first position and to prevent passage of the locking pin therethrough when the switch handle is in in the second position.

In some embodiments, the switch handle mechanism may include an escutcheon mounted on a front face of the cover and configured to receive the switch handle on a front side of the escutcheon and a link member disposed in an opening of the escutcheon and attached to at back side of the switch handle, the link member having a slotted recess therein configured to receive the second end of the shaft and the locking pin. A rear plate may be attached to a back side of the escutcheon, configured to retain the link member in the opening in the escutcheon and having a slot therein configured to receive the second end of the shaft and the locking pin. The rear plate may be configured to prevent removal of the locking pin therefrom when the switch handle is in the second position.

Further embodiments provide an apparatus including a switch handle movable between first and second positions and a mechanism configured to be mounted on a planar surface, mechanically linked to the switch handle and configured to receive an end of a shaft. The mechanism is configured to allow withdrawal of the end of the shaft from the mechanism when the switch handle is in the first position and to prevent withdrawal of the end of the shaft from the mechanism when the switch handle is in the second position. For example, the mechanism may include a slot configured to allow passage of a locking pin proximate the end of the shaft therethrough when the switch handle is in the first position and to prevent passage of the locking pin therethrough when the switch handle is in in the second position.

DETAILED DESCRIPTION

Figure 1:
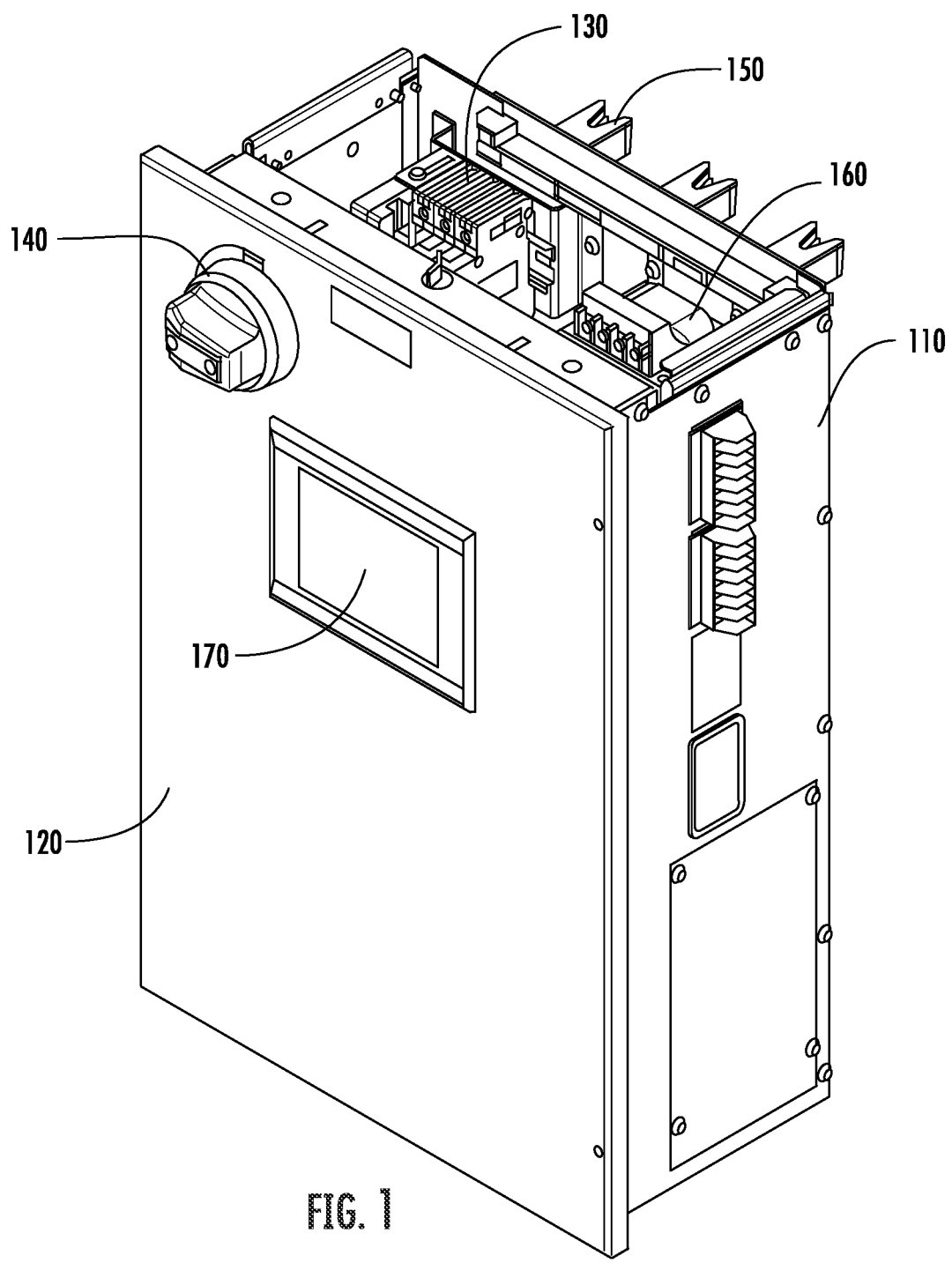
FIG. 1 is a perspective view of a motor control center (MCC) bucket with a panel-mounted switch actuator assembly according to some embodiments.

Specific exemplary embodiments of the inventive subject matter now will be described with reference to the accompanying drawings. This inventive subject matter may, however, be embodied in many different forms and should not be construed as limited to the embodiments set forth herein; rather, these embodiments are provided so that this disclosure will be thorough and complete, and will fully convey the scope of the inventive subject matter to those skilled in the art. In the drawings, like numbers refer to like items. It will be understood that when an item is referred to as being "connected" or "coupled" to another item, it can be directly connected or coupled to the other item or intervening items may be present. As used herein the term "and/or" includes any and all combinations of one or more of the associated listed items.

The terminology used herein is for the purpose of describing particular embodiments only and is not intended to be limiting of the inventive subject matter. As used herein, the singular forms "a", "an" and "the" are intended to include the plural forms as well, unless expressly stated otherwise. It will be further understood that the terms "includes," "comprises," "including" and/or "comprising," when used in this specification, specify the presence of stated features, integers, steps, operations, items, and/or components, but do not preclude the presence or addition of one or more other features, integers, steps, operations, items, components, and/or groups thereof.

Unless otherwise defined, all terms (including technical and scientific terms) used herein have the same meaning as commonly understood by one of ordinary skill in the art to which this inventive subject matter belongs. It will be further understood that terms, such as those defined in commonly used dictionaries, should be interpreted as having a meaning that is consistent with their meaning in the context of the specification and the relevant art and will not be interpreted in an idealized or overly formal sense unless expressly so defined herein.

FIGS. 1-4 provide various views of an MCC bucket assembly 100 according to some embodiments. The MCC bucket assembly 100 includes an enclosure 110 with a hinged or otherwise removable cover 120. Various circuitry is situated in the enclosure 110. The circuitry may include, for example, metering circuitry 160 that is coupled to a display 170 mounted on the cover 120. The assembly 100 further includes a disconnect switch assembly 130, which is actuated by a switch handle assembly 140 mounted on the cover 120. The disconnect switch assembly 130 is configured to receive power via a set of conductive stabs 150 mounted at a back face of the enclosure 110 and configured to mate with a set of external bus bars. The disconnect switch assembly 130 is configured to switchably distribute power to the metering circuitry 160 and/or other components within the enclosure 110.

Figure 2:
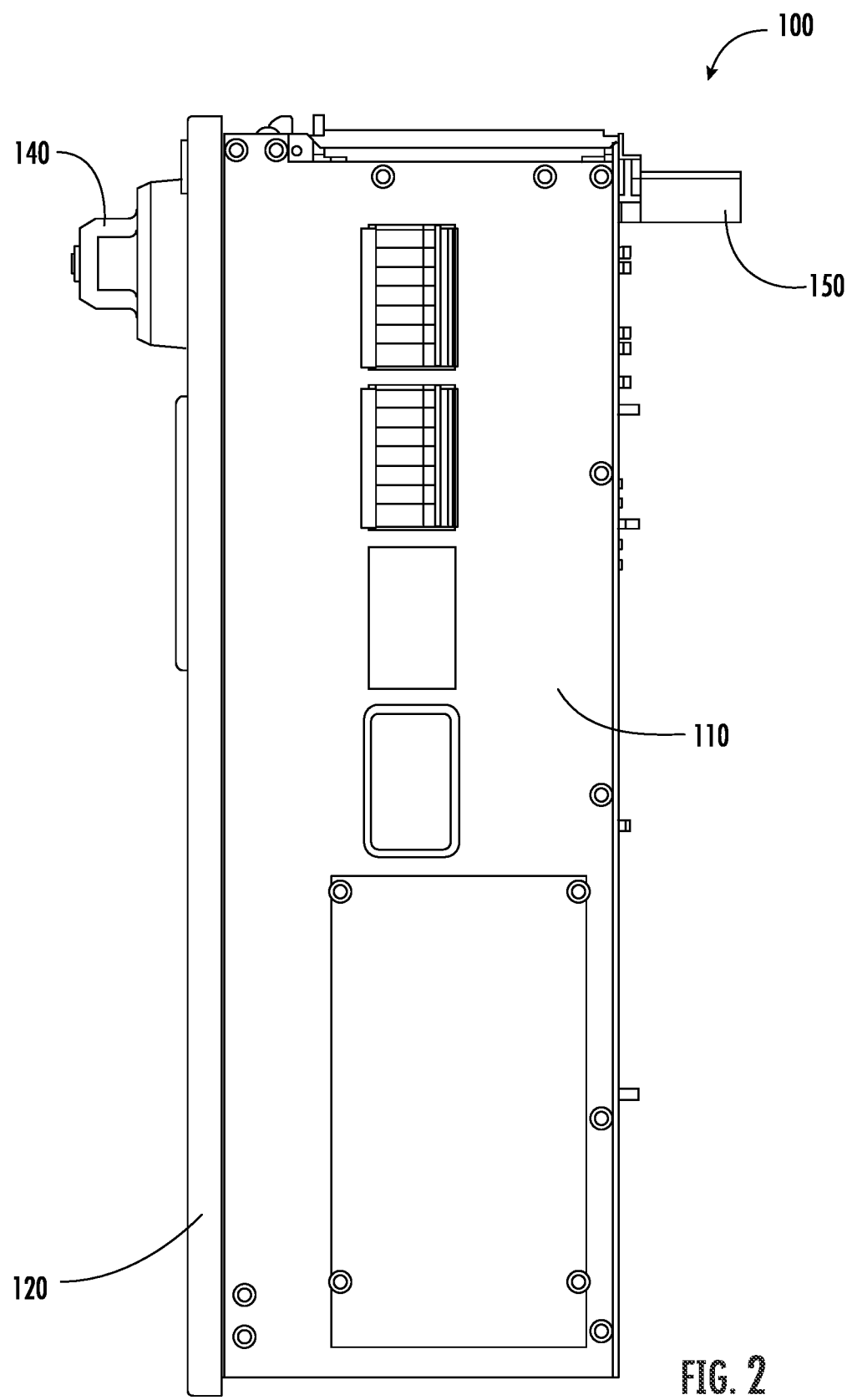
FIG. 2 is a side view of the MCC bucket of FIG. 1.
Figure 3:
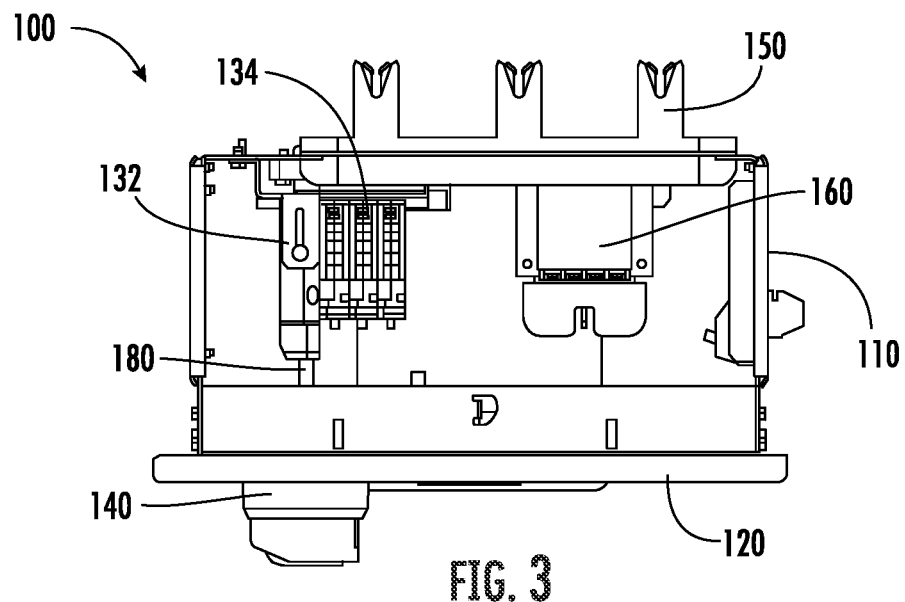
FIG. 3 is a top view of the MCC bucket of FIG. 1.
Figure 4:
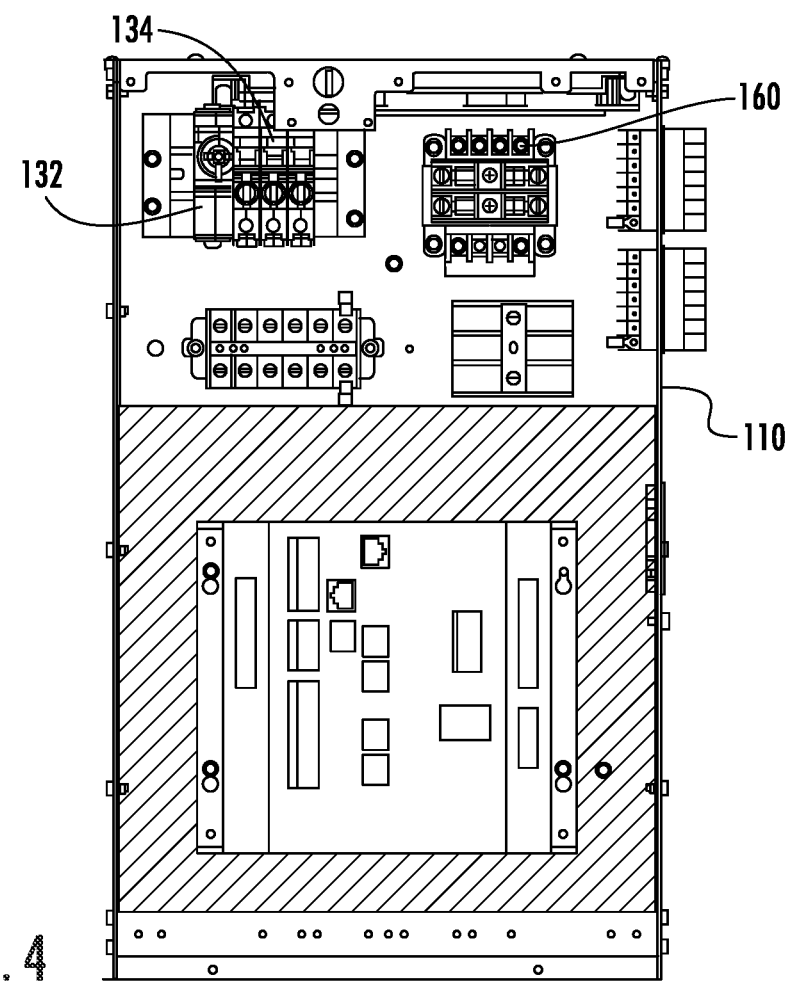
FIG. 4 is a front view of the MCC bucket of FIG. 1 with the front panel removed to show internal components.

Referring to FIG. 2, the switch handle assembly 140 is configured to actuate the disconnect switch assembly 130 via a connecting shaft 180 such that switches within the disconnect switch assembly are opened and closed by rotation of the switch handle assembly 140. As explained in further detail below, the shaft 180 and switch handle assembly 140 may be configured such that the front cover 120 may not be opened to provide access to the interior of the enclosure 110 unless the switch handle assembly 140 is in a position that causes the disconnect switch assembly 130 to be in an "off" state that de-energizes components within the enclosure 110.

Figure 5:
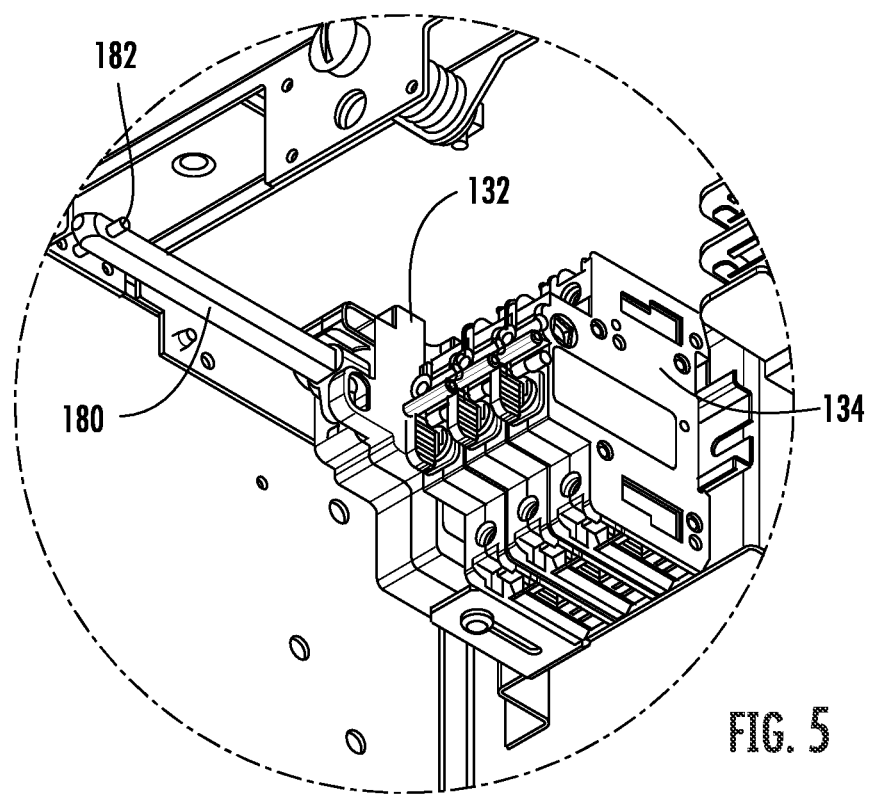
FIG. 5 is a detailed view of a circuit protector switch assembly and actuator shaft of the MCC bucket of FIG. 1.
Figure 6:
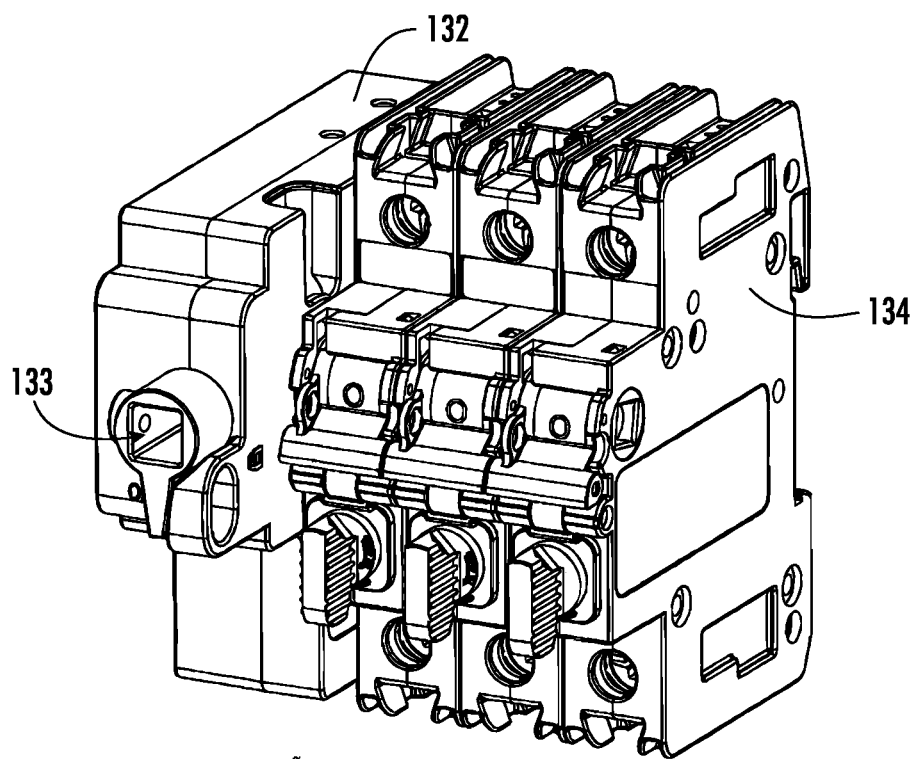
FIG. 6 is perspective view of the circuit protector switch assembly of FIG. 5.

FIGS. 5 and 6 provide detailed views of the disconnect switch assembly 130 and switch handle linking shaft 180. As shown, the disconnect switch assembly 130 includes a switch assembly 134 comprising a plurality of ganged switches, respective ones of which switch respective phases. A rotary actuator mechanism 132 receives the shaft 180 at a port 133 and actuates the ganged switches of the ganged switch assembly 134 responsive to rotation of the shaft 180. An example of such a disconnect switch assembly is the Bussman Series Compact Circuity Protector line of disconnect switches distributed by Eaton and described in Eaton Technical Data Sheet 10789 (2019).

Figure 7:
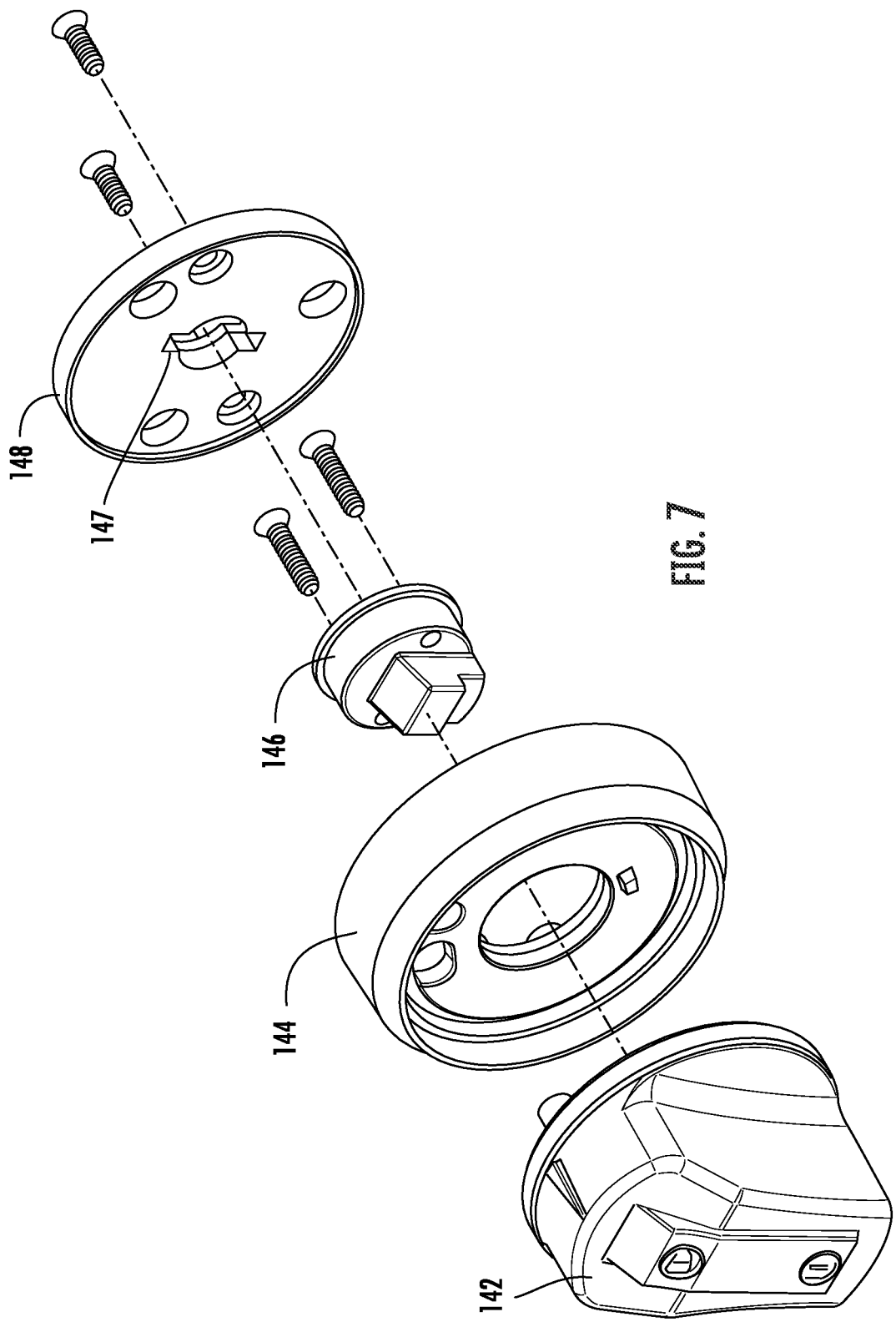
FIGS. 7 and 8 are exploded views of a front-panel-mounted switch actuator assembly of the MCC bucket of FIG. 1.
Figure 8:
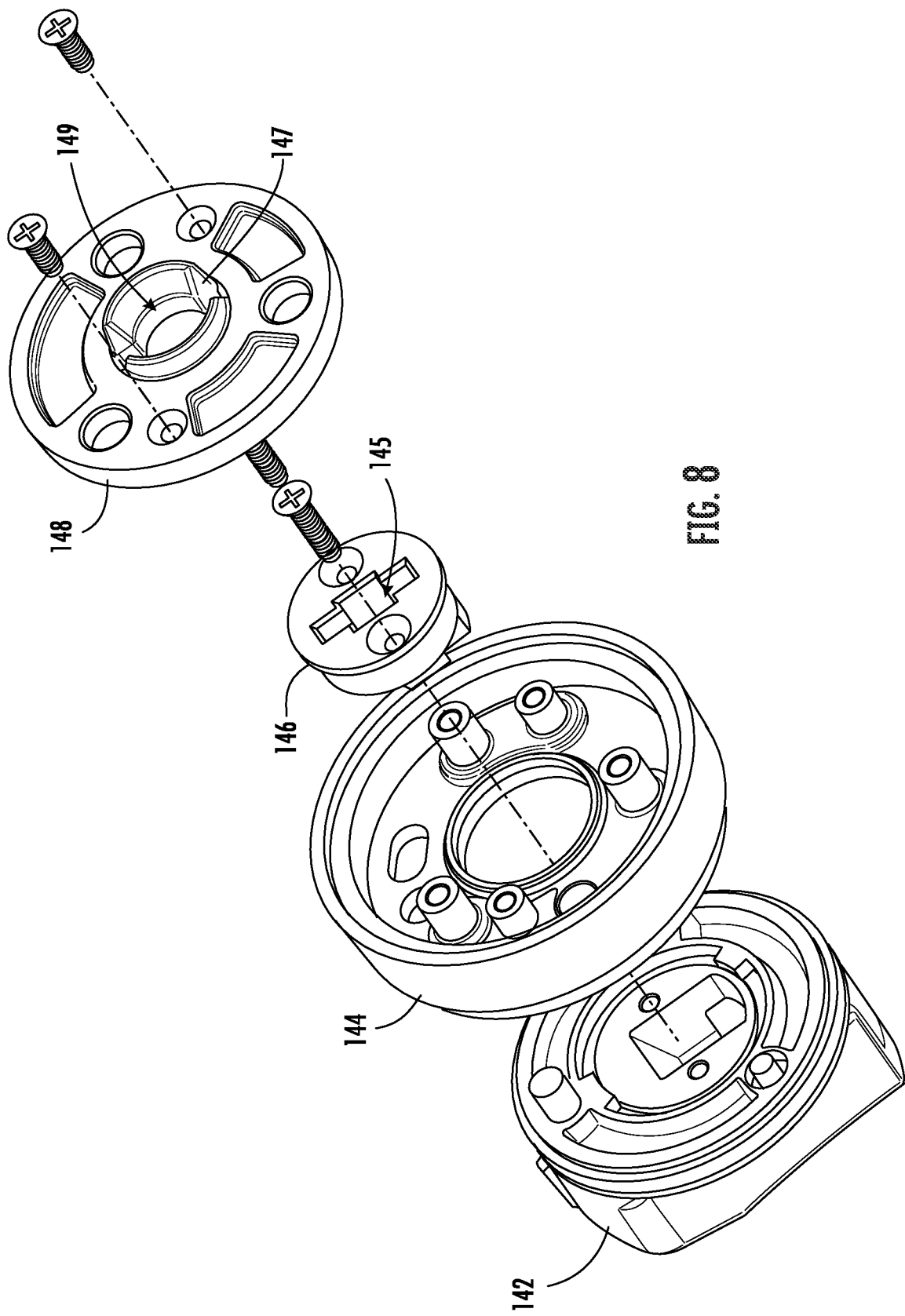

As further shown in FIG. 5, the shaft 180 has a locking pin 182 at an end of the shaft 180 distal from the point at which the shaft 180 is inserted into the port 133 of the rotary actuator mechanism 132. Referring to FIGS. 7 and 8, the switch handle mechanism 140 mounted on the cover 120 of the bucket 100 includes a switch handle 142 configured to rotate within an escutcheon 144 that is mounted on a front fact of the cover 120. A link member 146 is attached to a back side of the switch handle 142 by a first pair of screws and has a slotted recess 145 therein that is configured to receive an end of the shaft 180 and the locking pin 182. A rear plate 148 retains the link member 146 and is attached to the escutcheon 144 through the cover 120 by a second set of screws. The rear plate 148 includes a slotted opening 149 through which the locking pin 182 of shaft 180 passes to engage the link member 146. Slots 147 in the opening 149 are designed such that the locking pin 182 of the shaft 180 may pass through the opening 149 when the switch handle 142 is in an "off" position, thus enabling the shaft 180 to be inserted or withdrawn from the switch handle assembly 140 and the cover 120 opened or closed when components fed by the disconnect switch assembly 130 are de-energized. When the switch handle 142 is in an "on" position with the shaft 180 inserted in the link member 146, however, the locking pin 182 is retained by the rear plate 148, thus preventing removal of shaft 180 and opening of the cover 120 while the components fed by the disconnect switch assembly 130 are energized. Similarly, if the switch handle 142 is on the "on" position with the shaft 180 removed from the link member 146, the rear plate 148 prevents insertion of the shaft into the link member 146 and closing of the cover 120.

In the drawings and specification, there have been disclosed typical preferred embodiments of the invention and, although specific terms are employed, they are used in a generic and descriptive sense only and not for purposes of limitation, the scope of the invention being set forth in the following claims.

The invention claimed is:

1. An apparatus comprising:
   an enclosure having a cover configured to be opened;
   a disconnect switch positioned in the enclosure;
   a shaft having a first end inserted in the disconnect switch and configured to actuate at least one switch in the disconnect switch by rotation of the shaft; and
   a switch handle mechanism mounted on the cover, configured to receive a second end of the shaft when the cover is in a closed position, and comprising a switch handle configured to rotate the shaft, wherein the switch handle mechanism is configured to allow withdrawal of the second end of the shaft from the switch handle mechanism when the switch handle is in a first position and thereby allow opening of the cover and to prevent withdrawal of the second end of the shaft from the switch handle mechanism when the switch handle is in a second position and thereby prevent opening of the cover.

2. The apparatus of claim 1, further comprising a locking pin disposed proximate the second end of the shaft and wherein the switch handle mechanism comprises a slot configured to allow passage of the locking pin therethrough when the switch handle is in the first position and to prevent passage of the locking pin therethrough when the switch handle is in in the second position and thereby prevent opening of the cover when the switch handle is in the second position.

3. The apparatus of claim 2, wherein the switch handle mechanism comprises:
   an escutcheon mounted on a front face of the cover and configured to receive the switch handle on a front side of the escutcheon;
   a link member disposed in an opening of the escutcheon and attached to a back side of the switch handle, the link member having a slotted recess therein configured to receive the second end of the shaft and the locking pin; and
   a rear plate attached to a back side of the escutcheon, configured to retain the link member in the opening in the escutcheon and having a slot therein configured to receive the second end of the shaft and the locking pin.

4. The apparatus of claim 3, wherein the rear plate is configured to prevent removal of the locking pin therefrom when the switch handle is in the second position.

5. The apparatus of claim 1, wherein the enclosure comprises a motor control center (MCC) bucket enclosure.

6. An apparatus comprising:
an enclosure;
a cover moveable to expose an interior of the enclosure;
a switch handle movable between first and second positions; and
a mechanism mounted on a planar surface of the cover, mechanically linked to the switch handle and configured to receive an end of a shaft of a switch disposed in the interior of the enclosure, wherein the mechanism is configured to allow withdrawal of the end of the shaft from the mechanism when the switch handle is in the first position and thereby allow movement of the cover to expose the interior of the enclosure and to prevent withdrawal of the end of the shaft from the mechanism when the switch handle is in the second position and thereby prevent movement of the cover to expose the interior of the enclosure.

7. The apparatus of claim 6, wherein the mechanism comprises a slot configured to allow passage of a locking pin proximate the end of the shaft when the switch handle is in the first position and thereby allow movement of the cover to expose the interior of the enclosure and to prevent passage of the locking pin therethrough when the switch handle is in the second position and thereby prevent movement of the cover to expose the interior of the enclosure.

8. The apparatus of claim 7, wherein the mechanism comprises:
an escutcheon configured to be mounted on the planar surface and to receive the switch handle on a front side of the escutcheon;
a link member disposed in an opening of the escutcheon and attached to a back side of the switch handle, the link member having a slotted recess therein configured to receive the end of the shaft and the locking pin; and
a rear plate attached to a back side of the escutcheon, configured to retain the link member in the opening in the escutcheon and having a slot therein configured to receive the end of the shaft and the locking pin.

9. The apparatus of claim 8, wherein the rear plate is configured to prevent removal of the locking pin therefrom when the switch handle is in the second position.

10. The apparatus of claim 6, wherein the mechanism is configured to allow opening of the cover when the switch handle is in the first position and to prevent opening of the cover when the switch handle is in the second position.

* * * * *